(12) United States Patent
Ibn-Elhaj et al.

(10) Patent No.: US 9,618,839 B2
(45) Date of Patent: Apr. 11, 2017

(54) SURFACE RELIEF MICROSTRUCTURES, RELATED DEVICES AND METHOD OF MAKING THEM

(75) Inventors: Mohammed Ibn-Elhaj, Allschwil (CH); Julien Martz, Mulhouse (FR); Hubert Seiberle, Weil am Rhein (DE); Wolfgang Wernet, Neuenburg (DE)

(73) Assignee: ROLIC AG, Zug (CH)

( * ) Notice: Subject to any disclaimer, the term of this patent is extended or adjusted under 35 U.S.C. 154(b) by 945 days.

(21) Appl. No.: 13/148,849

(22) PCT Filed: Feb. 15, 2010

(86) PCT No.: PCT/EP2010/000909
§ 371 (c)(1),
(2), (4) Date: Sep. 29, 2011

(87) PCT Pub. No.: WO2010/094441
PCT Pub. Date: Aug. 26, 2010

(65) Prior Publication Data
US 2012/0027998 A1 Feb. 2, 2012

(30) Foreign Application Priority Data

Feb. 18, 2009 (EP) .................................... 09153151

(51) Int. Cl.
*G03F 7/00* (2006.01)
*B82Y 40/00* (2011.01)
(Continued)

(52) U.S. Cl.
CPC ............ *G03F 7/0002* (2013.01); *B82Y 40/00* (2013.01); *C25D 1/00* (2013.01); *C25D 1/10* (2013.01);
(Continued)

(58) Field of Classification Search
CPC .......... B82Y 40/00; G11B 7/261; C25D 1/10; C25D 1/00; G02B 5/0257; G02B 5/1847;
(Continued)

(56) References Cited

U.S. PATENT DOCUMENTS

| 5,084,351 A | 1/1992 | Philips et al. |
| 2006/0001971 A1 | 1/2006 | Schadt et al. |

(Continued)

FOREIGN PATENT DOCUMENTS

| CN | 1786746 A | 6/2006 |
| CN | 101016634 A | 8/2007 |

(Continued)

OTHER PUBLICATIONS

M.T. Gale, Replication Techniques for Diffractive Optical Elements, Microelectronic Engineering, vol. 34, year 1997, pp. 321-339.*

(Continued)

*Primary Examiner* — Jiong-Ping Lu
(74) *Attorney, Agent, or Firm* — Sughrue Mion, PLLC

(57) ABSTRACT

The present invention relates to a method for the replication of a patterned surface relief microstructure, comprising the steps of generation of a first layer with a patterned surface relief microstructure, generation of a master, by copying the microstructure of the first layer into a second layer, thereby involving at least one dry or wet etching step, characterized by an additional step, in which the microstructure of the master is brought into contact with a replica material, such that the microstructure of the master is reproduced in the replica.

The invention further relates to the elements made as a replica according to the method.

The surface relief microstructures are suitable to display images with a positive-negative and/or color image flip. The (Continued)

elements according to the invention are particularly useful for securing documents and articles against counterfeiting and falsification.

24 Claims, 7 Drawing Sheets

(51) Int. Cl.
  *G11B 7/26* (2006.01)
  *C25D 1/00* (2006.01)
  *C25D 1/10* (2006.01)
  *G02B 5/02* (2006.01)
  *G02B 5/18* (2006.01)
  *G02F 1/1337* (2006.01)

(52) U.S. Cl.
  CPC ......... *G02B 5/0221* (2013.01); *G02B 5/0257* (2013.01); *G02B 5/0268* (2013.01); *G02B 5/1847* (2013.01); *G02B 5/1857* (2013.01); *G02F 1/13378* (2013.01); *G03F 7/0017* (2013.01); *G11B 7/261* (2013.01); *Y10T 428/24479* (2015.01); *Y10T 428/24521* (2015.01)

(58) Field of Classification Search
  CPC .. G02B 5/0221; G02B 5/0268; G02B 5/1857; G02F 1/13378; G03F 7/0017; G03F 7/0002
  See application file for complete search history.

(56) References Cited

U.S. PATENT DOCUMENTS

| | | |
|---|---|---|
| 2006/0118426 A1 | 6/2006 | Choi |
| 2006/0134815 A1 | 6/2006 | Kishi |
| 2007/0020404 A1 | 1/2007 | Seiberle et al. |
| 2007/0196616 A1 | 8/2007 | Stalder et al. |
| 2008/0011934 A1* | 1/2008 | Verschuuren ....... B29C 33/3857 249/134 |
| 2009/0136687 A1 | 5/2009 | Seiberle et al. |
| 2009/0179418 A1 | 7/2009 | Stalder |

FOREIGN PATENT DOCUMENTS

| | | | | |
|---|---|---|---|---|
| EP | 1855127 A1 | 11/2007 | | |
| JP | 10-198259 A | 7/1998 | | |
| JP | 2004-177805 A | 6/2004 | | |
| JP | 2005-526275 A | 9/2005 | | |
| JP | 2006-163299 A | 6/2006 | | |
| WO | 01/29148 A1 | 4/2001 | | |
| WO | 2004/027460 A2 | 4/2004 | | |
| WO | WO2004027500 | * | 4/2004 | ......... G02F 1/13363 |
| WO | 2006/007742 A1 | 1/2006 | | |
| WO | 2007/131375 A1 | 11/2007 | | |
| WO | WO2007131375 | * | 11/2007 | ............... G02B 5/02 |

OTHER PUBLICATIONS

J.A. Dobrowolski, "Optical Thin-Film Security Devices"; Artech House, pp. 289-328, year 1998.
Bernhard Gaida, "Introduction to the Galvanic Technique", 2008, pp. 51, 200-204.
M.T. Gale, "Replication Techniques for Diffractive Optical Elements", Microelectronic Engineering. 1997, pp. 321-339, vol. 34.

* cited by examiner

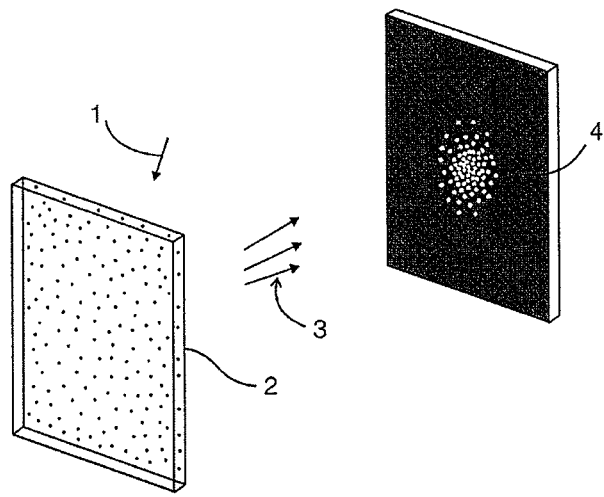
Fig. 1.1 PRIOR ART
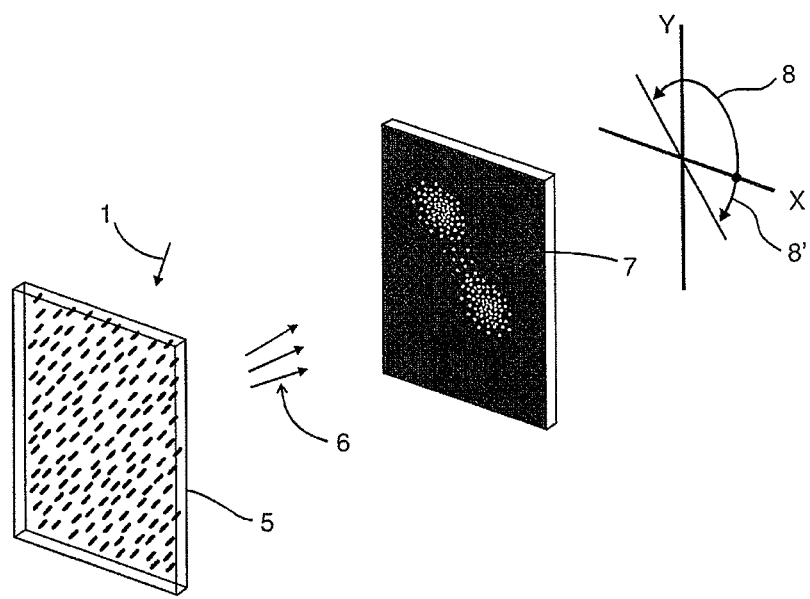
Fig. 1.2 PRIOR ART

Figure 5
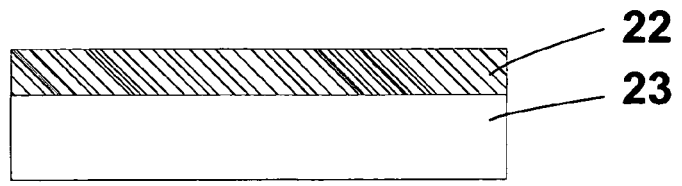
Fig. 5.1
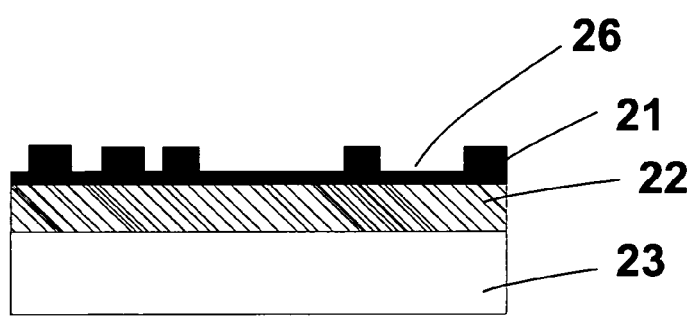
Fig. 5.2
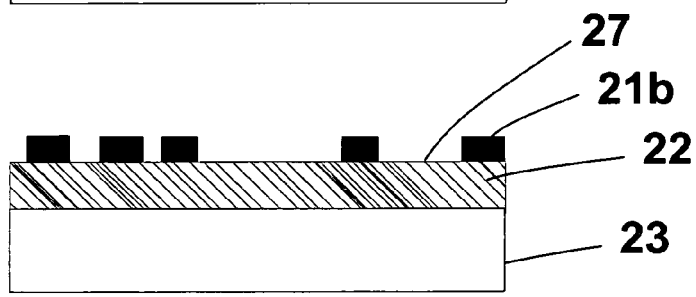
Fig. 5.3
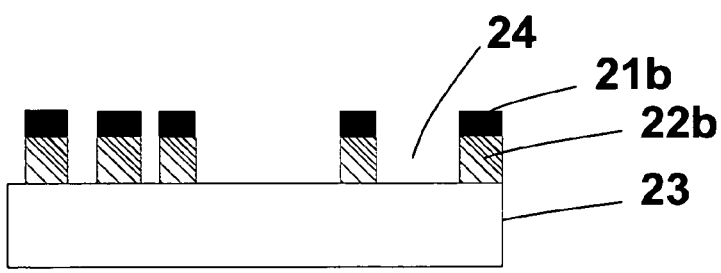
Fig. 5.4
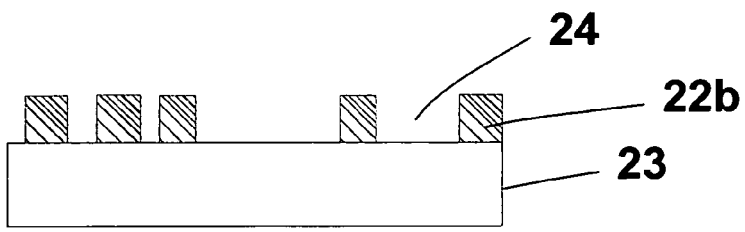
Fig. 5.5
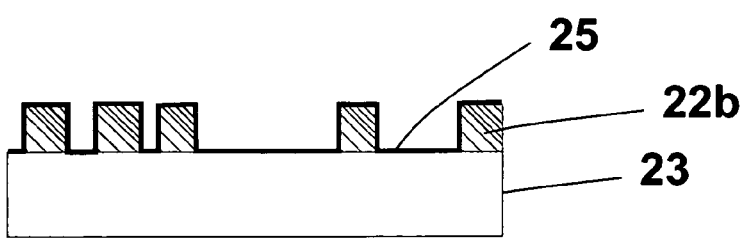
Fig. 5.6

Figure 6
Fig. 6.1
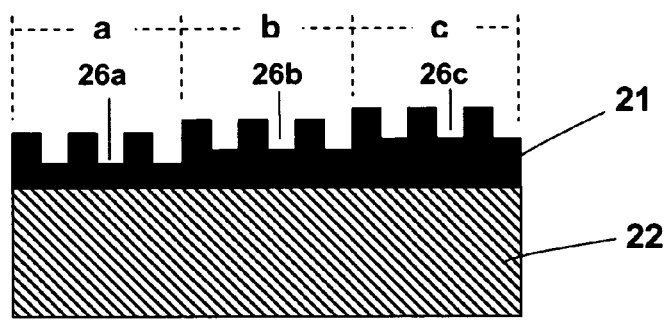
Fig. 6.2
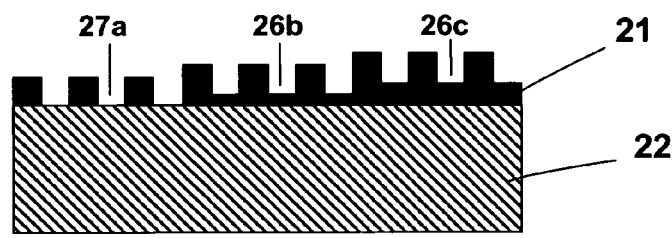
Fig. 6.3
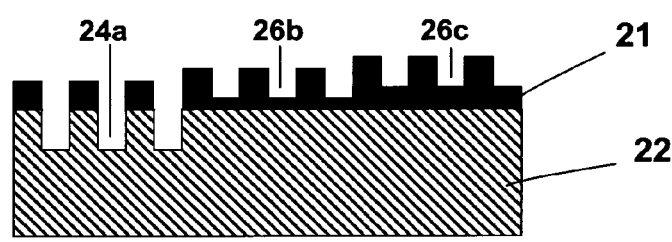
Fig. 6.4
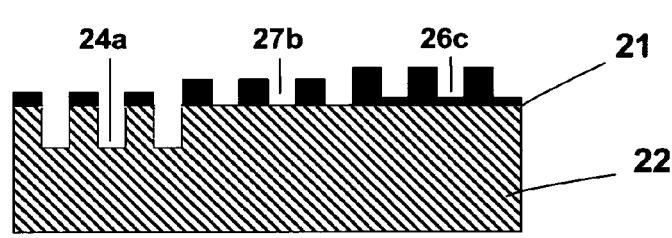
Fig. 6.5
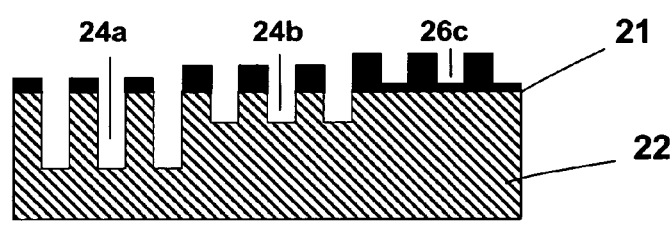
Fig. 6.6
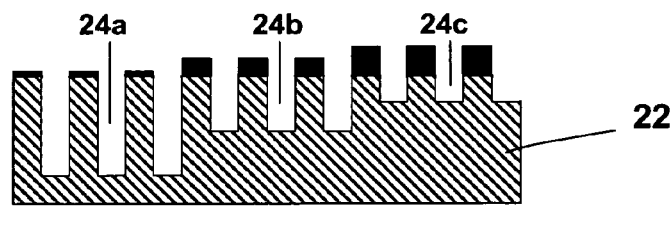
Fig. 6.7
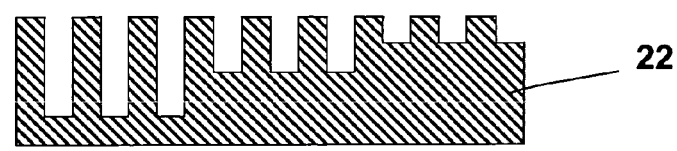

Figure 7
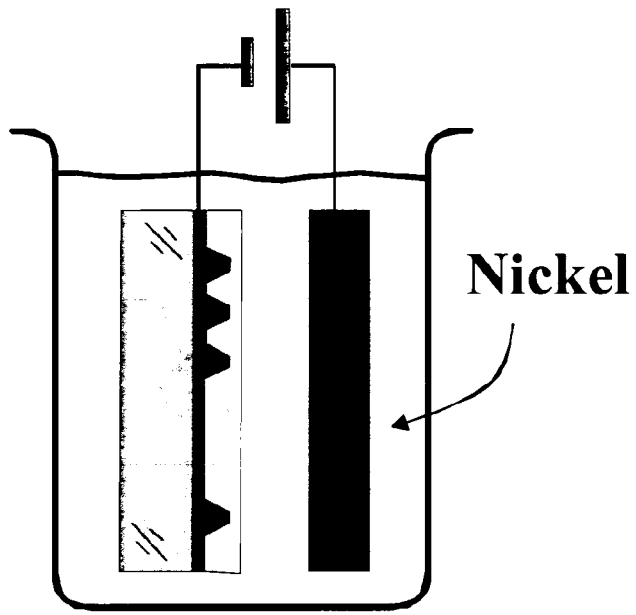
Figure 8
Fig. 8.1
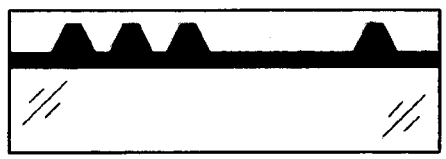
Fig. 8.2

Figure 10
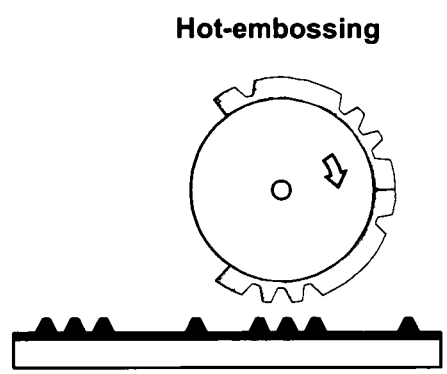
Fig. 10.1
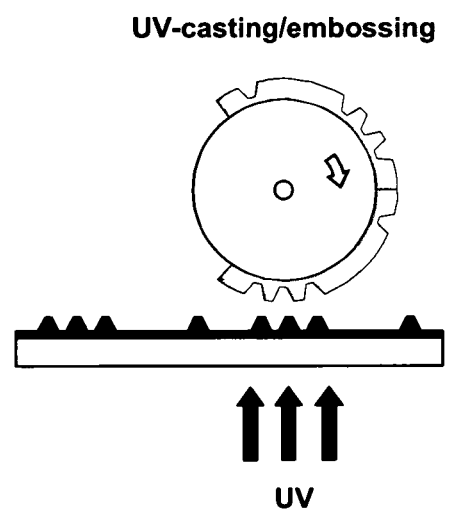
Fig. 10.2

SURFACE RELIEF MICROSTRUCTURES, RELATED DEVICES AND METHOD OF MAKING THEM

CROSS REFERENCE TO RELATED APPLICATIONS

This application is a National Stage of International Application No. PCT/EP2010/000909 filed Feb. 15, 2010, claiming priority based on European Patent Application No. 09153151.7, filed Feb. 18, 2009, the contents of all of which are incorporated herein by reference in their entirety.

TECHNICAL FIELD

The invention relates to a method to produce replicas of a patterned surface relief microstructure. The invention further relates to the elements made as a replica according to the method. The elements according to the invention are particularly useful for securing documents and articles against counterfeiting and falsification.

BACKGROUND OF THE INVENTION

The use of optical devices for the protection against counterfeiting, illegal tampering and product protection in general is now a well established art.

Due to increased fraud and counterfeit, novel anti-counterfeit measures are constantly required. For many years holograms have been the preferred security technology. Meanwhile, this technology is more than 30 years old and therefore well known and widespread. Holographic foils may even be found in every gift shop today. This situation represents a security risk since many people have access to the hologram technology.

It is thus most desirable to extend the palette of security devices by novel security features, which are clearly distinguishable from holographic devices. Examples of such new devices are alternative optically variable devices (OVD). OVDs are devices that change their appearance, such as brightness, contrast or colour, as the viewing angle or illumination angle is changed. Prominent representative colorshift OVDs are cholesteric or interference films, including optical devices based on flakes of such films. Both exhibit a pronounced colorshift as the device is tilted away from a perpendicular angle of view.

Colorshift effects due to the interference of light at thin optical films have a long tradition in the history of modern thin film components (e.g. J. A. Dobrowolski, "Optical thin-film security devices", in "Optical Document Security" ed. by R. L. van Renesse, Artechouse Boston 1998). Many different compositions of layered thin-film systems are possible. The reflection or transmission spectra are shifted towards the short wavelength side as the incidence angle increases. Multi-layer thin-film systems, often combinations of dielectric and metallic layers, are also possible with dielectric materials only. In this case, thin-films of different index of refraction are required.

Security devices based on either thin interference films or on flakes of such films are commercially available today. Examples can for instance be found in U.S. Pat. No. 5,084,351.

Other approaches are scattering devices. The use of isotropic and even more anisotropic scattering effects in OVDs can enhance the optical attractiveness significantly. Especially anisotropic light scattering is a helpful means to generate viewing angle sensitive devices. FIGS. 1.1 and 1.2 illustrate isotropic and anisotropic light scattering, respectively.

The reflection at an isotropically structured surface, such as a newsprint or most surfaces encountered in household articles, is such that no azimuthal direction is preferred. As indicated in FIG. 1.1, collimated incoming light 1 is redirected at the scattering surface 2 into new outgoing directions 3 with a characteristic axial-symmetric output light distribution and a characteristic divergence angle 4.

An anisotropically structured surface however reflects light in a pronounced way into certain directions and suppresses light in other directions. In FIG. 1.2, collimated incoming light 1 impinges on an anisotropically scattering surface 5 and is redirected into new outgoing directions 6 with a characteristic output light distribution 7, which depends on the corresponding azimuthal angle 8, 8'.

In the context of the present invention, the term anisotropy direction shall mean a local symmetry axis within the plane of a layer, for example the direction along grooves or valleys of a microstructure.

If a surface comprises a pattern of anisotropic structures with locally differing anisotropy direction, like the directions 10, 11 in FIG. 2, then the individual areas of the pattern reflect incoming light into different directions. The pattern may then be recognized by oblique observation or by using obliquely incident light.

A known method of manufacturing anisotropic scattering films with patterned anisotropy is described in the international patent application WO-01/29148, the content of which is incorporated hereby by reference. The method makes use of the so called monomer corrugation (MC) technology. It relies on the fact that phase separation of special mixtures or blends applied to a substrate is induced by crosslinking, for instance by exposure to ultraviolet radiation. The subsequent removal of non-crosslinked components leaves a structure with a specific surface topology. The term MC-layer is used for layers prepared according to this technology. The topology may be made anisotropic by the alignment of an underlying alignment layer. By using a patterned alignment layer, it is possible to create a patterned anisotropically scattering surface topology.

WO-2006/007742 discloses methods to produce modified MC-layers and layer structures, which generate pastel-colored appearance under certain observation angles.

WO07/131,375 discloses methods to generate optically effective surface relief microstructures by first manufacturing a mask comprising an image of the microstructure and then copying the image in a second step to a resin or resist to generate the optically effective surface relief microstructure. The content of WO07/131,375 is hereby incorporated by reference. A drawback of the methods disclosed in WO07/131,375 is that the number of process steps is high, which does not only increase production time but also decreases the manufacturing yield.

SUMMARY OF THE INVENTION

An object of the present invention is to provide simplified methods for the production of replicas of surface relief microstructures.

A further object of the present invention is to provide a master for the replication of surface relief microstructures.

A still further object of the present invention is to provide elements with surface relief microstructures, which are produced by replication, using a master according to the invention.

Preferably the copied surface relief microstructures are optically effective, which shall mean that incoming light is modulated in a characteristic way, depending on the surface relief microstructures. More preferably, the interaction with light is such that the light is diffracted, refracted or scattered.

The invention provides a method for the replication of a patterned surface relief microstructure, comprising the steps of generation of a first layer (21) with a patterned surface relief microstructure on top of a second layer, the first layer comprising a first material and the second layer comprising a second material generation of a master, by copying the microstructure of the first layer into the second layer, thereby involving at least one dry or wet etching step, characterized by an additional step, in which the microstructure of the master is brought into contact with a replica material, such that the microstructure of the master is reproduced in the replica material with an inverse surface relief profile as compared to that of the master.

The replica of a master has an inverse surface relief profile compared to that of the master. The replica of a master can also be used as a master (daughter master) to generate further replicas. A replica of a replica is called a higher order replica in the context of the present invention. In the context of the present invention a master is a device comprising a surface relief microstructure, which can be used to make replicas in a replication process and in particular includes the direct copy generated in the second layer and any replica or higher order replica thereof.

According to a preferred method of the invention a replica is used as a daughter master to replicate a patterned surface relief microstructure by bringing the daughter master into contact with a replica material, such that the microstructure of the daughter master is reproduced in the replica material with an inverse surface relief profile as compared to that of the daughter master.

According to another preferred method of the invention a higher order replica is used as a daughter master.

In the context of the present invention an inverse surface relief profile compared with a reference surface relief profile shall mean that its depth profile is the complement of the reference surface relief profile. This means, for example, that the valleys of the inverse surface relief correspond to the hills of the reference surface relief and the hills of the inverse surface relief correspond to the valleys of the reference surface relief.

The method of copying the surface relief microstructure from the first layer to the second layer comprises one or more dry or wet etching process steps.

In one of the etching steps the thickness of the first layer is reduced until the material in the lower zones (valleys) of the surface relief microstructure is cleared away and parts of the underlying second layer are set free. In a subsequent etching step the second layer is etched in those parts, which were set free during the prior etching step. If the materials and process conditions are selected properly, etching of the first and second layer can be performed in a single etching step.

Preferably, the first and the second material are not identical.

The replica material may be applied to the copied microstructure (master) by methods such as coating, printing, dipping, evaporation, sputtering, casting, electroless plating or electroplating. Instead of applying the replica material to the copied microstructure, the copied microstructure (master) can be used as an embossing tool to emboss the microstructure into the replica material.

By using a master according to the present invention it is possible to apply standard replication techniques to mass fabricate optical elements with a surface relief microstructure at adequate costs. Today, two popular and cost effective replication techniques are UV embossing and hot embossing (see for instance M. T. Gale: "Replication techniques for diffractive optical elements" in Microelectronic Engineering, Vol. 34, page 321 (1997)).

The replication process generates a relief in the surface of the replica, which is inverse to that of the master. After the replication process is finished, the replica is separated from the master. The replica can be used as an optical element according to the invention or it can itself be used as a master (daughter master) for making replica. While the daughter master exhibits an inverse surface relief profile compared to that of the original master, the replica of the daughter master shows the same surface relief profile as the original master.

The invention further provide optical elements comprising a patterned surface relief microstructure produced as a replica according to the methods of the invention.

Contrary to the method disclosed in WO07/131,375, the method according to the invention eliminates the manufacturing of a mask for the generation of a master. Accordingly, the number of process steps is decreased and consequently the manufacturing yield is increased.

According to a preferred embodiment of the invention the replica is generated by electroplating.

According to another aspect of the present invention, there is provided a master for the replication of a surface relief microstructure produced according to the methods of the invention.

In the context of the present invention the term 'copy of a microstructure' as well as the term 'copy', when related to the above method, mainly refers to the two-dimensional, lateral structure and does not necessarily mean that the original and the copied microstructure are perfectly identical. This means, for example, that the lateral distances of corresponding top levels (hills) and lower levels (valleys) are almost the same for the original and the copied microstructure. However, in general, the depth of the copied microstructure will not be identical to that of the original microstructure. It is even an advantage of the present invention that the depth of the copied microstructure can be adjusted and can be controlled by various process parameters. Preferentially, the depth of the copied microstructure is larger than that of the original microstructure. The copy process therefore preferably magnifies the depth profile of the microstructure.

In the context of the present invention a patterned surface relief microstructure shall mean that there is a pattern in the surface with at least two areas which differ in their microstructure. The pattern may also consist of areas, with and without microstructures. For example, a simple pattern would be one that has an area with no microstructure and another area with a microstructure. In general, the difference between the areas of a pattern may be any physical difference in the microstructure that causes a different interaction of the microstructures with light. For example, the differences may be due to the depth of the microstructure, the lateral density of the microstructure, the periodicity of the microstructure, the anisotropy of the microstructure, the direction of the anisotropy axis. Any combination of the above properties of pattern areas is also possible. For example, there may be one area, which has an isotropic microstructure, another area, which has an anisotropic microstructure with a first anisotropy axis, another area which has an anisotropic microstructure with a second anisotropy axis and still another area may have no microstructure. The microstructure may be isotropic or anisotropic. In a preferred embodiment of the invention there is at least one area of the pattern, which comprises an anisotropic microstructure.

A pattern may represent any kind of information, such as for example images, letters, numbers, bar codes, pictures, microtext, graphical components, finger prints, encrypted information, holographic data, digital data and any combination thereof.

The microstructure may be periodic or non-periodic. In a preferred embodiment of the present invention the pattern comprises at least one area in which the microstructure is non-periodic.

A helpful parameter to characterize non-periodic or non-deterministic surface profiles is the autocorrelation function and a related autocorrelation length. The one-dimensional or two-dimensional autocorrelation function of a surface profile can be understood as a measure for the predictability of the surface profile for two spatially separated points by a distance x in the plane.

The autocorrelation function AC(x) of a function P(x), such as the surface relief microstructure profile, is defined as $$AC(x) = \int P(x') \cdot P(x'+x) \cdot dx'$$

More details on the autocorrelation function and corresponding programming issues can be found e.g. in "Numerical recipes in C: the art of scientific computing/William H. Press; Saul A. Teukolsky; William T. Vetterling; Brian P. Flannery.—Cambridge; New York: Cambridge University Press, 1992".

For a non-periodic or non-deterministic surface profile, the autocorrelation function decays rapidly with increasing x. On the other hand, for a deterministic surface profile found for instance in a grating, the autocorrelation does not decay. In the case of the grating the autocorrelation function is however modulated with a periodic function. For a nearly periodic grating the envelope decays with increasing x as well.

With the help of the one-dimensional autocorrelation function, a single characteristic number, an autocorrelation length L, can be defined. It is the length for which the envelope of the autocorrelation function decays to a certain threshold value. For the present purpose, a threshold value of 10% of AC(x=0) proved to be suitable.

According to a preferred embodiment of the present invention the pattern comprises at least one area with a surface relief microstructures, which in at least one direction has an averaged one-dimensional autocorrelation function AC(x) that has an envelope, which decays to 10% of the AC at x=0 within an autocorrelation length, wherein the autocorrelation length is smaller than three times an average lateral distance between adjacent transitions of top and bottom regions. For anisotropic surface modulations the one direction is perpendicular to an anisotropy axis.

More preferred are surface relief microstructures, wherein the autocorrelation length is smaller than two times an average lateral distance between adjacent transitions of top and bottom regions. Even more preferred are surface relief microstructures, wherein the autocorrelation length is smaller than one average lateral distance between adjacent transitions of top and bottom regions.

In another preferred embodiment the autocorrelation length (L) is greater than one hundredth average lateral distance between adjacent transitions of top and bottom regions.

In still another preferred embodiment of the present invention the pattern comprises areas of anisotropic microstructures with different directions of the anisotropy axes. Since the light in a given direction is reflected or suppressed depending on the specific local orientation, an image of bright and dark pixels can be seen in an optical element made as a replica according to the invention. In addition, such elements exhibit a pronounced change from positive to negative view when they are tilted or rotated. Such patterned surface elements can be made from black and white but also from gray scale images and can for example be generated as follows. In case of a gray scale image the image is first rastered, that means, the image is split into dark and bright zones with a certain pixel resolution, in order to reduce the gray scale image to a black and white image. The dark zones of the black and white images are then attributed to anisotropically scattering zones of a first orientation direction and the bright zones are attributed to anisotropically scattering zones with a different orientation direction, e.g. perpendicular to the first orientation direction. An element with a pattern of pixels arranged like this will appear as positive under a first viewing angle and will flip to the negative as the device is e.g. rotated by 90°.

Alternatively, a gray scale image may be digitized in a number of gray values in order to assign individual orientation directions to each of the digitized gray values. Instead of digitized gray values, the continuous gray scale can be converted into continuously varying orientation directions.

According to still another preferred embodiment of the invention the pattern comprises areas with a surface modulation of transitions from bottom regions to top regions and from top regions to bottom regions, wherein in a (first) lateral direction of the surface area there is (in average) at least one transition from a top region to a bottom region or vice versa within every 20 micrometer, and preferably additionally in a second lateral direction of the surface area, which is perpendicular to the first direction, there is in average at least one transition from a top region to a bottom region or vice versa within every 200 micrometer.

In a preferred embodiment, the pattern comprises areas in which in a first lateral direction, the average lateral distance between adjacent transitions from a top region to a bottom region or vice versa lies in the range from 0.5 micrometer to 10 micrometers. Advantageously, the average lateral distance lies in the range from 0.5 micrometer to 5 micrometers. Advantageously in the second lateral direction, which is perpendicular to the first lateral direction, the average distance between transitions from a top region to a bottom region is less than 100 micrometers, more advantageously less than 50 micrometers.

To describe anisotropic surface relief structures the term surface relief aspect ratio (SRAR) is defined for the context of this invention as the average length to width ratio of the anisotropic surface relief patterns. The SRAR strongly determines the azimuthal optical appearance of light scattered at the surface relief microstructure. For SRAR=1, which corresponds to surface relief patterns which exhibit in average the same extension in at least two lateral directions, the scattering properties for incident light is almost independent on the azimuthal incident angle of the light. Therefore, the intensity of light reflected from the surface of relief microstructures with SRAR=1 does almost not change when the element containing the surface relief microstructure is rotated along an axis perpendicular to the surface of the element.

For anisotropic relief structures, which means SRAR>1, the intensity of the reflected light depends on the azimuthal incidence angle of the light. In order to be able to visually recognize this dependency on the azimuthal incident angle, SRAR should be larger than 1.1. To increase the visible contrast of images set-up of patterns of surface relief structures with different anisotropic axis, SRAR values larger than 2 are preferable. Even more preferable are SRAR values larger than 5.

For very large SRAR values the range of azimuthal angles into which a significant amount of light is scattered becomes smaller, which makes it more difficult to recognize the reflected light from an image made of surface relief patterns. Therefore, preferably, there is at least one area in which the SRAR is less than 50, more preferably the SRAR is less than 20.

In the context of the present invention the term 'surface relief fill factor' is defined as the ratio of the total area of top regions to the integrated area over all top and all bottom regions. Preferably, there is at least one area in which the surface relief fill factor lies in the range from 0.050 to 0.95, more preferably in the range of 0.2 to 0.8 and even more preferably in the range of 0.3 to 0.7.

If a two step etching process is used to copy the surface relief microstructure from the first layer to the second layer, wherein in the first step only the first layer is etched and the second etching step only affects the second layer then the copy process will kind of digitize the depth profile of the first layer. The reason is that the etching of the second layer only takes place in those parts, which were cleared away in the first layer. Because the etching velocity in the second layer is the same at each of those parts, the depth of the structure copied into the second layer is almost everywhere the same. This results in a microstructure with mainly two plateaus, a top plateau and a bottom plateau. There may be different plateaus, if microstructures are generated with different depths in different areas.

In the context of the present invention a plateau shall be defined as an area within a microstructure in which the height of the structure varies less than 20% of the mean depth of the structure.

According to a preferred embodiment of the invention the top regions (hills) of the surface relief microstructure copied into the second layer form upper plateaus which substantially lie in the same upper height level and the bottom regions (valleys) of the surface relief microstructures copied into the second layer form lower plateaus which substantially lie in the same lower height level, such that the relief modulation depth is substantially equal over the surface area. Substantially the same upper and lower height level shall mean that the height variation of the upper and of the lower plateaus is less than 20%, preferably less than 10%, even more preferably less than 5% of the mean depth of the surface relief microstructure.

According to still another aspect of the invention there is provided an optical element comprising a patterned relief microstructure produced as a replica using a master.

Preferably, optical elements according to the invention are at least partially reflective. The optical elements according to the invention therefore preferably comprise reflective or partially reflective layers using materials such as gold, silver, copper, aluminum, chromium or pigments. The reflective or partially reflective layers may further be structured such that they cover only part of the optical element. This can be achieved, for example, by structured deposition of the layer or by local de-metallization.

Reflection can also be caused by a transition to a material having a different index of refraction. Therefore, in a preferred embodiment of the invention the surface of the microstructure of an optical element according to the invention is covered with a dielectric material. Examples of high index refraction materials are ZnS, ZnSe, ITO or TiO2. Composite materials including nanoparticles of high index refraction materials could also be suitable. The cover medium may also be absorptive for certain colors to change the color appearance of the device.

Particularly for security applications, the surface relief microstructures of an optical element according to the invention may be sealed in order to protect the element against mechanical impact, contamination and in order to prevent unauthorized and illegal making of replicas of such elements. Therefore, optical elements according to the invention preferably comprise a dielectric layer on top of the microstructure. Adequate protection and passivation films are transparent dielectric materials, which may be optionally colored.

Due to the patterned surface relief microstructure, the optical elements according to the invention locally transmit and/or reflect the light differently depending on the local microstructure. Therefore, the microstructure pattern can be seen as a pattern of different intensities in transmission and/or reflection when illuminated with light. Depending on the types of microstructure, there will be a strong dependency of the optical appearance on the angle of the incident light and/or the observation angle.

Depending on the depth of the microstructures interference colours may be generated. A broad color palette may be obtained, for example, from lower to deeper modulation the colors yellow, orange, rose, violet, blue and green. For even deeper structures, higher order colors can appear. The interference colours typically show a pronounced angular dependency. Under certain angles the colours will be seen, whereas for other angles the colours may change or disappear. A pattern is therefore recognized as a coloured pattern, for which the colours depend on the observation angle and/or the incident angle of the light.

Optical elements according to the invention may also incorporate other security features. Some of them may already be present in the master used for production of the elements. Such features are, for example, holograms or kinegrams. Other security features, which could be first, second or third level security features, may be added in an additional process and/or in an additional layer. The additional features may be permanently visible without generating a specific optical effect. Preferably, the additionally added feature shows a viewing angle dependency, for example realized by again by holograms or kinegrams or by cholesteric or interference layers. In a more preferred embodiment a second level security feature is added, which can not be detected without using an observation tool. Such features are for example introduced by fluorescent or by birefringence materials. Especially preferred are birefringent layers which comprise areas of different retardation or optical axis orientation. The security feature stored in such a birefringent layer is only visible by observation with polarized light, for example using polarizer sheets.

Optical elements produced according to the present invention can be used in different applications which deal with spatial modulation of the light intensity. Preferably the optical elements according to the invention are used as security elements in security devices. Specifically such security devices are applied to or incorporated into documents, passports, licenses, stocks and bonds, coupons, cheques, certificates, credit cards, banknotes, tickets etc. against counterfeiting and falsification. The security devices further can also be applied as or incorporated into brand or product protection devices, or into means for packaging, like wrapping paper, packaging boxes, envelopes etc. Advantageously, the security device may take the form of a tag, security strip, label, fiber, thread, laminate or patch etc.

A merit function based on the height histogram may be helpful to characterize the pronounced surface relief plateaus. A possible merit function M is the following:

$$M = \frac{d}{\sqrt{(\Delta x_1)^2 + (\Delta x_2)^2}}$$

The merit function M uses a relation of peak widths and relief modulation depth. The range of deviations of the top and bottom regions around their plateau should lie within a certain defined fraction of the relief modulation depth. $\Delta x1$ and $\Delta x2$ are the width of the two histogram peaks as measured at the height 1/e of the full peak height, wherein e is the base of the natural logarithm (e≈2.72), and d is the distance of the two peaks (which corresponds to the average plateau to plateau distance or the relief modulation depth). The surface relief microstructures used in the method of the invention preferably have a merit function M, which is greater than two. More preferably, M is greater than 3.5.

BRIEF DESCRIPTION OF THE DRAWINGS

FIG. 1.1 is an illustration of light reflection at an isotropically structured surface.

FIG. 1.2 is similar to FIG. 1.1, but illustrates the characteristic output light distribution from a reflection at an anisotropically scattering surface.

FIG. 5.6 Metallisation process of the copied surface relief microstructure.

FIG. 6 illustrates process steps to create areas with different microstructure depths in a copy of a surface relief microstructure.

FIG. 7 Replication of the master by electroplating (galvanic Nickel metal film growth).

FIG. 8 Separation process of the master Ni Shim. FIG. 8.1 illustrates the configuration after completion of the electroplating step. FIG. 8.2 illustrates the separation process of the master from the Ni-shim.

FIG. 10 Replication and mass-production of the final element. FIG. 10.1 illustrates the hot-embossing process and FIG. 10.2 illustrates the UV-casting and/or embossing process.

DETAILED DESCRIPTION OF THE INVENTION

Figure 2:
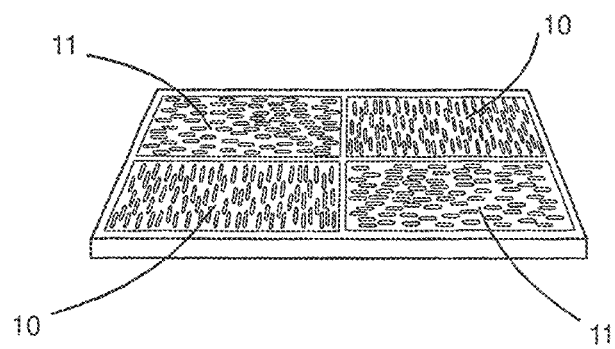
FIG. 2 illustrates pixels with differing anisotropy direction orientation.
Figure 3:
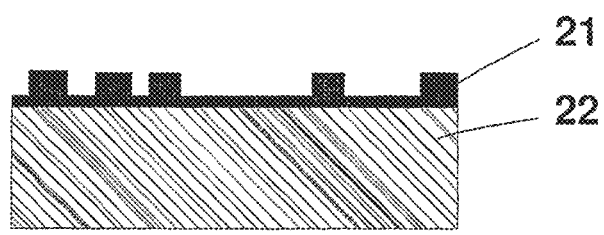
FIG. 3 shows the initial layer comprising a surface relief microstructure on top of a second material layer, which is thick enough to function as a substrate
Figure 4:
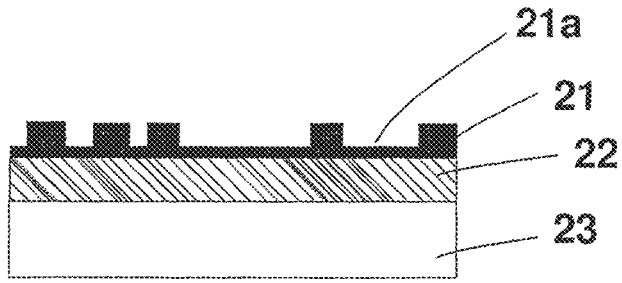
FIG. 4 shows the initial layer comprising a surface relief microstructure on top of a second material layer, which is a thin layer on a substrate FIGS. 5.1 to 5.5 illustrates the copy process of a surface relief microstructure from a first layer into a second layer.

The first material comprising the surface relief microstructure is typically deposited in the form of a thin layer on top of the second material. This is illustrated in FIG. 3, where the first material comprising the surface relief microstructure is denoted as layer 21 and the second material is denoted as layer 22. Layer 22 may be in the form of a substrate, as implied by FIG. 3, or it may itself be deposited as a layer on a substrate 23, as illustrated in FIG. 4. Above description of the layers is related to the function of the layers according to the invention. However, each of the layers may comprise sub-layers, for example to improve adhesion and or each material may be a composite material, for example to modify material properties or to support the generation of the surface relief microstructure. In particular, layer 21 may comprise an alignment layer to define the orientation directions for anisotropic surface relief microstructures and/or an adhesion promoter layer.

The surface relief microstructure is copied from a first material to a second material using one or more dry or wet etching process steps. The depth of the microstructure can be controlled by various process parameters and material properties. A preferred dry etching process is plasma etching. Preferred gases for plasma etching are oxygen, argon, chlorine, boron trichloride and flourocarbons.

In principle, any kind of material can be used for the substrate 23, such as glass, plastic, metal, ceramics, silicon, fused silica. Specific process conditions, such as for example the use of specific solvents, heating processes etc., have of course to be taken into account for the selection of the substrate material, since some substrate material properties may be affected by the process conditions. The substrate may comprise a special coating to increase the resistance to critical process parameters, in particular to increase the resistance to solvents.

Any kind of material can be used for layer 22, such as glass, plastic, metal, ceramics, silicon, fused silica and the like. If layer 22 is to be used as a thin layer on a substrate 23, only materials will be useful, which can be applied as thin layers. Preferably, layer 22 is of metal. Preferred metals are aluminum, silver, is chromium and copper. The selection of the material for layer 22 will, however, be made by taking into account the specific process conditions, in particular regarding the etching velocity in the individual etching steps. In a preferred embodiment the thickness of layer 22 is larger than 60 nm. Even more preferred, the thickness of layer 22 is larger than 90 nm.

Layer 21 will typically consist of materials that can be coated or evaporated. Preferably, layer 21 comprises a polymerized and/or a cross-linked material.

Preferably the etching velocity in at least one of the etching steps is different in the first material (layer 21) and in the second material (layer 22). The etching velocity depends on parameters, such as the nature of the materials used in layers 21 and 22, on the type of etching (which may be dry or wet), on the type of etching solution and on the temperature in case of a wet etching process and on the type of gas and on the energy used in case of a dry etching process.

There are different known methods to generate a surface relief microstructure on top of layer 21, such as self organization in copolymer or dewetting, locally removing material from the surface by irradiation with a laser beam, scratching the surface of layer 21 with the tip of an atomic force microscope (AFM) to generate grooves, electrolytically etching of metal or semiconductors, such as aluminum or silicon, writing with an electron beam, generating an MC-layer, embossing using a surface relief pattern as an embossing tool, local polymerization or cross-linking at the surface of a layer comprising pre-polymers and subsequently removing pre-polymers from areas in which no polymerization or cross-linking took place.

It is also possible to combine several of above methods to generate a surface relief microstructure. This is particularly useful for the generation of a pattern of locally different microstructure properties, such as the depth of the microstructure and the lateral geometry. It is also possible to create a pattern with anisotropic microstructures. For example, a first anisotropic surface relief microstructure with a first anisotropy axis may be generated by embossing. A second microstructure, for example with a different anisotropy axis or a different periodicity, can then be generated in individual areas by scratching with the tip of an AFM in order to create a pattern of microstructures with locally different properties.

The microstructure may be isotropic or anisotropic. It is also possible, that in some areas the microstructure is isotropic and in other areas the microstructure is anisotropic. The microstructure may be periodic or non-periodic or a combination of both. It is also possible that the microstructure exhibits a superposition of structures of different periodicities.

A preferred method for the generation of a surface relief microstructure uses phase-separation and crosslinking of a mixture of crosslinkable and non-crosslinkable materials (MC-technology). The surface microstructure is obtained by making a mixture of at least two materials of which at least one is crosslinkable and at least one other is non-crosslinkable, applying the mixture to a substrate, cross-linking at least a substantial portion of the crosslinkable material, and removing at least a substantial portion of the non-crosslinkable material. For microstructures, which shall be anisotropic, the crosslinkable material can be maintained in an oriented state, e.g. by means of an underlying orientation layer or an orientating substrate surface, during cross-linking. In this case layer 21 comprises at least two sublayers.

In a preferred method, the manufacturing of layer 21 comprises the steps of coating a thin photo-alignment film, generation of an orientation pattern by exposing individual areas of the photo-alignment film to linearly polarized UV light of different polarization directions, coating a blend of crosslinkable and non-crosslinkable liquid crystal materials on top of the photo-alignment film, cross-linking the liquid crystalline blend and removing the non-cross-linked material, for example using an adequate solvent. Even more preferred is a method, which additionally comprises the step of coating an adhesion promoter layer prior to coating the thin photo-alignment film.

Cross-linking of the liquid crystalline blend is preferable done by exposure to actinic light. The cross-linking process induces a phase separation and cross-linking of the liquid crystal prepolymer. The basic principles and the optical behavior of micro-corrugated thin-films are for example disclosed in the international patent application WO-A-01/29148.

According to the invention, the method for copying the surface relief microstructure involves a step in which the thickness of layer 21, which comprises the surface relief microstructure, is reduced by wet or dry etching, until the material of layer 21 in the lower zones 26 of the corrugated surface is cleared away and parts 27 of the underlying layer 22 are set free. This corresponds to the steps from FIGS. 5.2 to 5.3. Preferably, the materials for layers 21 and 22 and the etching conditions are selected such that the etching velocity in layer 21 in this process step is at least two times higher than in layer 22. Most preferably, the etching conditions are such, that layer 22 is hardly etched in this step. As a result, layer 22 is partly covered only by the material of the upper zones 21b of the microstructure in the initial layer 21.

In a next step, layer 22 is etched through the freed parts 27 of layer 21 by dry or wet etching. By this process, micro-structured holes or grooves 24 are etched into layer 22, corresponding to the lower zones of the microstructure of film 21. In the areas corresponding to the upper zones of the microstructure of film 21 the material 22b is remained, as shown in FIG. 5.4. Thus the microstructure of layer 21 is copied into layer 22 by this process. Preferably, the materials for layers 21 and 22 and the etching conditions are selected such that in this process step the etching velocity in layer 22 is at least two times higher than in layer 21. Most preferably, the etching conditions are such, that the material of layer 21 is hardly etched in this step. In case layer 22 is a thin layer on a substrate 23, the etching time can be selected such that all of the metal in the freed parts are etched away. In this case, a well defined and identical depth of the microstructure in layer 22 over the whole surface is achieved.

According to the invention, a single etching step can be used alternatively, in which both, the material of layer 21 and layer 22 are etched at the same time. In this case it is preferable to select the materials for layers 21 and 22 and the etching conditions such that the etching velocity in layer 22 is higher than in layer 21. More preferably, the etching velocity in layer 22 is more than two times higher than in layer 21. Most preferably, the etching velocity in layer 22 is more than five times higher than in layer 21. In such a single etching process, the etching of layer 22 already starts in those areas which correspond to the lower zones 26 (grooves, valleys) of the microstructure in layer 21, while the etching of layer 21 continues. Although such a process may require better control of the process parameters, it reduces the number of process steps and may also decrease the total processing time.

The depth of the microstructure etched into layer 22 depends on the etching time and the etching velocity in layer 22. Consequently, it is possible to adjust the depth of the microstructure by controlling the etching time. Preferably, the depth of the copied microstructure is larger than 60 nm, more preferably, the depth of the copied microstructure is larger than 90 nm.

Preferably, the depth of the copied microstructure is less than 1 µm, more preferably, the depth of the copied microstructure is less than 700 nm.

According to the invention a patterned surface relief microstructure may comprise areas of different depths. As a result, an optical element employing such a microstructure appears with locally different colors or grey levels, which in addition change upon observation at different angles. According to a preferred embodiment of the invention, the depth of the copied microstructure is different in different areas. There are a number of methods to generate areas of different depths in the copied microstructure. These methods are in principal based on locally blocking or delaying etching of layer 22.

In a first embodiment the average thickness of the lower part 26 of layer 21, which corresponds to the average distance between the top of layer 22 and the valleys 26 in layer 21, is different in different areas. FIG. 6.1 depicts a microstructure in layer 21, which comprises three areas a, b, c with different distances of the microstructure valleys 26a, 26b, 26c to the top of layer 22. Valleys 26a exhibit the smallest and 26*c* the largest distance to layer 22. The first etching step of layer 21, in which the thickness of layer 21 is reduced, is then controlled such, that only below the valleys 26*a*, within the area a, the material of the surface relief microstructure is cleared away such that the corresponding parts 27*a* of the underlying second layer 22 are set free (FIG. 6.2). In the subsequent etching step layer 22 is etched only in these 27*a* parts (FIG. 6.3).

To copy the microstructure of area b into layer 22 the etching steps are repeated, which means that layer 21 is etched again to further reduce its thickness until the material below the valleys 26*b* of the surface relief microstructure is cleared away and parts 27*b* of the underlying second layer 22 are set free (FIG. 6.4). Thereafter, layer 22 is etched again, which has the consequence, that etching in the 27*b* parts of area b starts while etching in area is continued (FIG. 6.5).

In a third round of etching, the material below the valleys 26*c* is etched away, so that in another etching step of layer 22 also the microstructure of area c can be etched into layer 22, following above procedure (FIG. 6.6). While etching area c, etching of areas a and b is continued. Finally, the remaining parts of layer 21 can be removed.

The resulting microstructure in layer 22 (FIG. 6.7) exhibits three areas a, b, c, in which the depth of the copied microstructure is different. The depth of the microstructure in the grooves 27*a*, 27*b*, 27*c* does not have to be linear to the ratio of the heights of the valleys 26*a*, 26*b*, 26*c*, as the depth of the grooves in layer 22 depends on the etching conditions, in particular etching time, used in the individual etching steps.

A microstructure like in FIG. 6.7 leads to different color or grey level appearance and different optical angular behaviour of the different areas.

According to a preferred embodiment of the invention, the multiple etching process as described above is replaced by a single etching process step, by choosing the materials of layers 21 and 22 as well as the etching conditions such, that both materials can be etched in the same process, for example in the same wet etching process step. Preferably the etching velocity is higher in layer 22. More preferably, the etching velocity in layer 22 is more than two times higher than in layer 21. When starting etching a microstructure like in FIG. 6.1, the material below the valleys 26*a*, 26*b* and 26*c* have first to be removed before etching starts in layer 22. Etching is then continuously progressing, following the sequence of FIGS. 6.1 to 6.7. The delay of etching into layer 22 depends linearly on the layer 21 thicknesses below the valleys 26*a*, 26*b* and 26*c*, provided that the etching velocity is constant over time. Therefore, the different depths in areas a, b, c are controlled by the different levels of 26*a*, 26*b*, 26*c*.

In FIG. 6 the rectangular form of the microstructure in layer 21 has only been chosen for simplicity of illustration and shall not imply any restriction to a specific shape. The form of the microstructure in layer 21 depends on the method used to generate it and may be of any shape. Also there may be any number of areas with different depth of the microstructure generated in layer 22. The three areas in FIG. 6 are just an example.

There are different methods to generate a microstructure with different height levels of the valleys as in FIG. 6.1. The different height levels may be prepared before generating the microstructure, for example by starting with a layer of uniform height. The thickness patterning may then be created by locally applying thin layers of the same or another material, for example by printing or vacuum deposition techniques or by locally removing material from the top of the layer, for example by dry or wet etching or laser ablation. It is also possible to directly apply layer 21 with different thicknesses in different areas. After the different height levels are established, the microstructure is generated on top of the layer. The different height levels of the valleys may also be prepared after the microstructure is present, for example by locally applying thin layers of the same or another material, for example by printing or vacuum deposition techniques or by reducing the thickness of layer 21 different in different areas, for example by using dry etching. The different height levels of the valleys may also be achieved by creating microstructures with locally different depths in a layer with uniform thickness. The process to generate different depths of the microstructure depends on the method which generates the microstructure. For example by embossing a microstructure already exhibiting different depths of the structure, scratching with the tip of an AFM using locally different forces, by applying different energies using laser ablation or if MC-technology is used by applying locally different light intensities or light energies in order to control phase separation and therefore the microstructure depth.

In an alternative embodiment to generate different depths of the grooves in layer 22 the process starts from a microstructure in layer 21 with uniform height levels of the valleys as in FIG. 5.2, in which after the first etching step the material below the valleys is removed as in FIG. 5.3. By locally applying thin layers of an appropriate material a configuration like in FIG. 6.2 can be achieved, which can be further processed according the description related to FIG. 6 above.

Instead of locally applying thin layers, which adopt the shape of the microstructure and yield in a configuration similar to FIG. 6.2, a material different from the material of layer 21 may be applied in certain areas on the etched layer 21, even as a thicker layer which fills the grooves of the microstructure and does not reproduce its shape, in order to protect the freed parts 27 of layer 22 in the certain areas from being etched. The material for protecting certain areas should be chosen such that it can be selectively removed, for example by a solvent, without removing the material of layer 21. Etching of the microstructure into layer 22 is then only performed in areas which are not covered. After removing the protecting material fully or in certain areas only, etching of layer 22 can be continued with the effect that additional areas of the microstructure of layer 21 are copied into layer 22, while the depth of the microstructure in the area copied in the first etching step increases. The above procedure may be repeated several times in order to create a number of different areas exhibiting different depth of the microstructure in layer 22.

In an alternative method for the generation of grooves of different depths, a pattern of thin layers of an appropriate material is applied on top of layer 22 before application of layer 21, for example by standard printing techniques, such as ink jet printing, or by vacuum deposition. The resulting structure corresponds to that of FIG. 6.1, wherein in areas b and c the lower parts of layer 21 comprise the additional layer(s) as sublayer(s). The additional process steps then follow those described above in regard to FIG. 6.

After the step which etches the microstructure into layer 22 the remaining parts of layer 21 may be stripped off with suitable solvents or solutions or by other means, such as plasma cleaning or the like (FIG. 5.5).

The microstructure in layer 22 which was copied from layer 21 can be used as a master for making replica and is also called an original master.

According to the invention, replicas of the master are made by bringing the microstructure of the master into contact with another material (the replica material) such that, due to the contact with the replica material, the surface relief microstructure of the master is reproduced with an inverse surface relief profile in the replica material.

Replica materials may be polymers, cross-linkable monomers and metals, such as for example nickel, chromium, aluminum and the like.

The replica material may be applied to the microstructure by methods such as coating, printing, dipping, evaporation, sputtering, casting, electroless plating or electroplating. In case the replica material is applied by electroplating it may be required to first deposit a thin metal layer, such as silver, chromium, gold, copper, aluminum and the like, on top of the microstructure, in order to achieve good electrical conductivity (FIG. 5.6). Instead of applying the replica material to the master, the master can be used as an embossing tool to emboss the surface relief microstructure into the replica material by known methods. Replica materials may be polymers, crosslinkable monomers, metals such as for example a nickel, chromium, aluminum and the like.

After the replication process is finished, the replica is separated from the master. The replica can be used as an optical element or can itself be used as a master (daughter master) for making replica. While the replica of the original master exhibits an inverse surface relief profile relative to that of the original master, the replica of the replica shows the same surface relief profile as the original master.

Depending on the type of replication process and on the applied process conditions, the depth of the replicated microstructure may be smaller than that of the master it is replicated from. Preferably, the depth of the replicated microstructure is larger than 70%, more preferably larger than 80% and even more preferable larger than 90% of the depth of the corresponding part of the microstructure of the master.

In a preferred method of the invention, replicas of the original master are formed by electroplating. Typically nickel is used as a replication material. The resulting replica is called a nickel-shim. The original master as well as the daughter masters can be used many times to make replicas. Replicas from replicas can be made in the same way as described above for the original master.

Typically for mass production of replicas to be used for example as optical elements roll to roll production equipments are used. For example a polyester film or other similar material, coated with an acrylic coating, moves through the equipment. Under severe heat and pressure, the shim pushes the surface relief microstructure onto the film (FIG. 10.1). The embossed film is then re-wound onto a roll.

Alternatively to embossing, the UV casting method can be used. UV casting is especially useful to fabricate deep micro-structures and/or very stable OVD devices (FIG. 10.1). Depending on the specifications of the final device, several types of substrates can be used, either metalized, semi-metalized or transparent with or without heat transfer function.

For some applications, it is preferable to apply the metal layer after embossing or UV-casting. In this case, a metal layer can be deposited onto the microstructure by vacuum deposition. Optionally another coating of lacquer can be applied to the film, for example to create a surface that can be imprinted with ink.

Example 1

FIG. 5 illustrates the copy process of a surface relief microstructure into a metal layer according to the invention.

A glass or plastic substrate 23 is coated with a 100 nm thick metal layer 22 of aluminum using standard coating techniques such as evaporation or sputtering.

On the metal layer 22, a layer 21 which exhibits a surface relief microstructure is generated (FIG. 5.2) according to the MC-technology procedure described above and disclosed in WO-A-01/29148 using a photo-alignment layer, which is sequentially exposed in different areas to UV-light with different polarization directions employing chromium photo-masks, thus defining an orientation pattern.

Layer 21 is then plasma etched until part of the underlying aluminum layer is set free at the position of the lower zones 26 of the microstructure (FIG. 5.3). This treatment can be done using a standard oxygen and or argon plasma depending on the nature of the material of layer 21. As a result, the thickness of layer 21 is reduced and the aluminum layer 22 is partly covered only by the material of the upper zones 21$b$ of the microstructure in the initial layer 21.

In a next step, the partly freed aluminum layer 22 is wet etched using an adequate etch solution (FIG. 5.4). By this process, micro-structured holes or grooves 24 are etched into the aluminum layer 22, corresponding to the lower zones 26 of the microstructure of layer 21. In the areas corresponding to the upper zones of the microstructure of layer 21 the aluminum 22$b$ remains. Thus this process has copied the microstructure of layer 21 into the aluminum layer 22. This microstructure is then used as an origination for further processing. The depth of the microstructure in layer 22 can for example be controlled and adjusted by the etching time in combination with the temperature of the etching solution. The etching time can be selected such that all of the metal in the freed parts is etched away. In this case, a well defined and identical depth of the microstructure in layer 22 over the whole surface is achieved.

Optionally, the remaining material of the upper zones 21$b$, can be completely removed (see FIG. 5.5) using a plasma etching process as described above.

In a next step, the obtained micro-structured aluminum layer is further processed by sputtering a thin silver layer 25 onto the microstructure 22$b$ (FIG. 5.6) to achieve good electrical conductivity. A typical thickness is about 80 nm or higher.

The obtained conductive master is then mounted into a frame and put inside a tank along with a supply of nickel (FIG. 7). The metallic layer 25 is connected to a DC-power supply to produce an electric current, which causes that the microstructure is electroplated with nickel. Current intensity and duration are adjusted to get the required nickel layer thickness. This process can take from several tens of minutes to a few hours, depending on the desired thickness of the nickel layer (see for example the text book of Bernard Gaida, "Introduction to the Galvanic technique" 2008, ISBN 978-3-87480-242-0). The frame with the electroplated microstructure on the substrate is then removed from the tank and washed with deionized water.

The metal master shim, which is the thin, nickel coating, is removed off the master plate (FIG. 8). This shim comprises the negative (inverse) of the original surface relief microstructure in the origination.

It has been found experimentally that due to the easy separation of the Ni-Shim and the master, the same master can be used several times for preparation of Ni-Shims.

Figure 9:
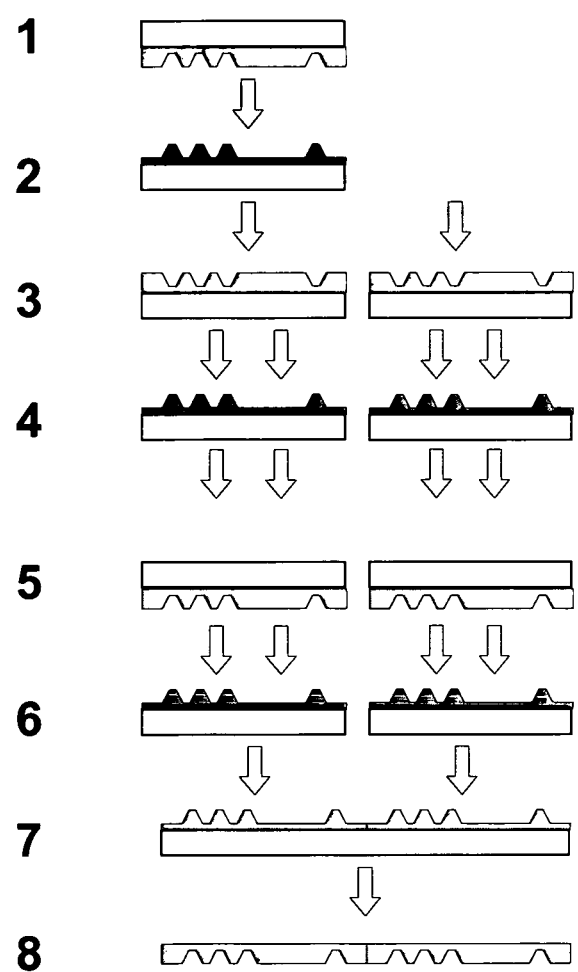
FIG. 9 Electroforming and recombination processes for the fabrication of the production Nickel shim or foil.

Using the same processes, several shims are created. Those that are produced from the metal master shim are known as "grandmothers,". "Grandmother shim" contains positive images of the origination. At this times, various copies of the original image can be duplicated (see FIG. 9)

in rows on one shim and are used to print multiple copies with a single impression (re-combination). Successive generations of shims are known by various names like "mothers", "daughters", and "stamper shims". These generations of shims alternate between negative and positive images of the origination. The stamper shims (or production shims) are used when actual production runs to print the final elements and these shims are negative images.

Example 2

In contrary to example 1, layer 21 comprising the surface relief microstructure is generated on top of a metal substrate as illustrated in FIG. 3. The parameters for the generation and etching of layer 21 are the same as in example 1. In contrary to example 1, the etching process of layer 22 does not stop automatically, because the substrate 22 is much thicker than layer 22 in example 1. Depending on the substrate used, several etching means can be used either wet etching using adequate solutions or dry etching using adequate gases. For instance, silicon is cleaned and etched using standard methods. (Optionally), a HF based solution can be used to remove oxide (either native oxide layer or a oxide coated layer) followed by a strong rinse in DI water.

In a next step anisotropic or isotropic etching is performed to achieve the required microstructure depth, for example by using KOH as an etching solution. The depth of the microstructure in layer 22 can, for example, be controlled and adjusted by the etching time in combination with the temperature of the etching solution.

After having copied the surface relief microstructure from layer 21 to the substrate layer 22 with the desired depth the further processing steps are the same as those in example 1.

Example 3

Layer 21 comprising the surface relief microstructure was applied on top of a Silicon wafer, which was previously coated with thin layer of a silane derivative as an adhesion promoter. Etching of layer 21 was done by dry etching in oxygen plasma with an oxygen flow of 250 ml/min. and a power of 160 W for 7 min. Before layer 22 was etched, the oxide layer on top of substrate 22 was removed in a buffered HF based solution in water and subsequently strongly rinsed with de-ionized water. In the next step, the microstructure was etched into substrate 22 in an etching solution of 40% by weight of potassium hydroxide (KOH) in water, at a temperature of 50° C. for 3.5 minutes. The resulting depth of the microstructure in layer 22 was measured using an AFM as 500 nm. By visual observation the silicon wafer (layer 22) in the area of the copied microstructure appeared as green, whereas when observed from another angle it appeared yellow.

Finally, the remaining material of the upper zones 21*b* was completely removed (FIG. 5.5) by oxygen plasma with a gas flow of 250 ml/min. and a power of 160 W for 8 min.

Example 4

The obtained micro-structured layer of example 3 was replicated in a polymer film. A mixture of multi-acrylate compounds was spin-coated on top of the microstructure surface generated in example 3. Subsequently the coated acrylate layer was cross-linked at room temperature by exposure to UV-A light. The resulting polymer film was then removed from the silicon wafer. By visual observation of the film the area which was in touch with the microstructure of the silicon wafer microstructure appeared green under a first angle, whereas when observed from another angle it appeared yellow. Hence, the microstructure of the silicon wafer was replicated in the polymer film. The depth of the microstructure was measured by AFM from which a value of 500 nm resulted.

The invention claimed is:

1. Method for the replication of a patterned surface relief microstructure, comprising the steps of
generation of a first layer on top of a second layer, wherein the first layer comprises a patterned surface relief microstructure, the first layer comprising a first material and the second layer comprising a second material, wherein the second material comprises metal or silicon,
copying the microstructure of the first layer into the second layer, by involving at least one dry or wet etching step, which transforms the second layer into an original master,
characterized by an additional step, in which a replica material is brought into contact with the microstructure in the original master, such that due to the contact with the replica material, the microstructure of the original master is reproduced in the replica material with an inverse surface relief profile as compared to that of the original master.

2. Method according to claim 1, wherein in one of the etching steps the thickness of the first layer is reduced until the material in the lower zones of the surface relief microstructure is cleared away and parts of the underlying second layer are set free.

3. Method according to claim 1, wherein the depth of the copied microstructure is larger than that of the original microstructure.

4. Method according to claim 1, wherein the depth of the copied microstructure is different in different areas.

5. Method according to claim 1, wherein there is at least one area of the pattern, which comprises an anisotropic microstructure.

6. Method according to claim 1, wherein the pattern comprises at least one area in which the microstructure is non-periodic.

7. Method according to claim 1, wherein there is at least one area in which the surface relief aspect ratio (SRAR) is less than 50.

8. Method according to claim 1, wherein there is at least one area in which the surface relief fill factor lies in the range from 0.2 to 0.8.

9. Method according to claim 1, wherein the patterned surface relief microstructure is generated by MC-Technology.

10. Method according to claim 1, wherein the pattern comprises areas with a surface modulation of transitions from bottom regions to top regions and from top regions to bottom regions, wherein in a (first) lateral direction of the surface area there is (in average) at least one transition from a top region to a bottom region or vice versa within every 20 micrometers.

11. Method according to claim 10, wherein additionally in a second lateral direction of the surface area, which is perpendicular to the first direction, there is in average at least one transition from a top region to a bottom region or vice versa within every 200 micrometers.

12. Method according to claim 1, characterized by an additional step in which the replica is used as a daughter master to replicate a patterned surface relief microstructure by bringing the daughter master into contact with a replica material, such that the microstructure of the daughter master is reproduced in the replica material with an inverse surface relief profile as compared to that of the daughter master.

13. Method according to claim 12, in which a higher order replica is used as a daughter master.

14. Method according to claim 13, characterized in that before the microstructure of the daughter master is brought into contact with the replica material, a thin metal layer is applied on top of the microstructure.

15. Method according to claim 1, characterized in that before the microstructure of the master is brought into contact with the replica material, a thin metal layer is applied on top of the microstructure.

16. Method according to claim 1, characterized in that the replica material is applied to the microstructure by one of coating, printing, dipping, evaporation, sputtering, casting, electroless plating or electroplating.

17. Method according to claim 1, characterized in that the surface relief microstructure is embossed into the replica material.

18. Method according to claim 1, characterized in that the second layer is in the form of a substrate and is a silicon wafer.

19. Method according to claim 1, characterized in that the thickness of the second layer is larger than 60 nm.

20. Method according to claim 1, characterized in that the thickness of the second layer is larger than 90 nm.

21. Method according to claim 1, wherein the second material comprises metal.

22. Method according to claim 21, wherein the second material comprises aluminum.

23. Method according to claim 21, wherein the second material comprises silver, chromium, or copper.

24. Method of using a replica of a surface relief microstructure, comprising providing a replica of a surface relief microstructure produced according to the method of claim 1 as a master for further replication.

* * * * *